(12) United States Patent
Fang et al.

(10) Patent No.: US 7,455,552 B1  
(45) Date of Patent: Nov. 25, 2008

(54) OVERMOLDED ELECTRONIC ASSEMBLY WITH METAL SEAL RING

(75) Inventors: Ching Meng Fang, Singapore (SG); Kin Yean Chow, Singapore (SG); Larry M. Mandel, Noblesville (IN); Sim Ying Yong, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/069,036

(22) Filed: Feb. 6, 2008

(51) Int. Cl.
*H01R 13/58* (2006.01)

(52) U.S. Cl. ...................................... 439/606; 439/736

(58) Field of Classification Search ................. 439/606, 439/610, 736
See application file for complete search history.

(56) References Cited

U.S. PATENT DOCUMENTS

| | | | | |
|---|---|---|---|---|
| 4,766,520 A | * | 8/1988 | Huber et al. | 439/76.1 |
| 4,952,529 A | * | 8/1990 | Grider | 439/736 |
| 5,020,996 A | * | 6/1991 | Cheng | 439/76.1 |
| 5,097,592 A | * | 3/1992 | Schultz et al. | 29/832 |
| 5,244,415 A | * | 9/1993 | Marsilio et al. | 439/610 |
| 5,980,329 A | * | 11/1999 | Klein et al. | 439/736 |
| 6,159,022 A | * | 12/2000 | Tsai | 439/76.1 |
| 6,601,296 B1 | * | 8/2003 | Dailey et al. | 29/848 |
| 6,855,006 B2 | * | 2/2005 | Brooks et al. | 439/606 |
| 7,201,585 B2 | * | 4/2007 | Pirner et al. | 439/76.1 |
| 7,278,862 B2 | * | 10/2007 | Nagashima et al. | 439/79 |

* cited by examiner

*Primary Examiner*—Briggitte R Hammond  
(74) *Attorney, Agent, or Firm*—Jimmy L. Funke

(57) ABSTRACT

An improved overmolded electronic assembly includes a backplate, a circuit substrate on the backplate, at least one electronic component mounted on the circuit substrate, conductive traces on the circuit substrate which together with the electronic component(s) defines a circuit device, an electrical connector, a metal ring on an outer side of a thermoplastic wall member of the electrical connector, and an overmold body. The metal ring circumscribes external connector pins of the electrical connector, and the overmold body together with the backplate and thermoplastic wall member of the electrical connector sealingly encase the circuit substrate and the circuit device defined on the substrate, with the overmold body having a peripheral edge in adhesive contact with the metal ring. The invention avoids delamination problems associate with similar arrangements which do not incorporate a metal ring.

7 Claims, 1 Drawing Sheet

OVERMOLDED ELECTRONIC ASSEMBLY WITH METAL SEAL RING

TECHNICAL FIELD

This invention relates to overmolding of the electronic assemblies and more particularly to an electronic assembly having features that enhance overmolding integrity.

BACKGROUND OF THE INVENTION

In a conventional electronic assembly having a circuit device contained in an overmold package, the overmold material is typically bonded to a thermoplastic body of an electrical connector, with a seal between the electronic device contained in the package housing and the external environment being provided in part by an adhesive bond between the thermoplastic body of the electrical connector and the overmolding material. This arrangement provides several benefits including durability, mechanical resistance to shock and vibration, and protection of the circuit device from the surrounding environment. However, there is a compound delamination issue at the interface between the thermoplastic body of the electrical connector and the overmolding material when the package is exposed to thermal cycling. It is believed that this delamination problem is attributable to a substantial difference between the coefficient of thermal expansion of the thermoplastic body of the electrical connector in a direction that was transverse to the direction of flow of the thermoplastic material during the molding process as compared with the coefficient of thermal expansion of the thermoplastic body in a direction that was parallel to flow during the molding process. For example, with a typically glass-filled thermoplastic material, the coefficient of thermal expansion in a direction that was transverse to the flow direction during the molding process is about three times the coefficient of thermal expansion in a direction that was parallel to flow during the molding process.

SUMMARY OF THE INVENTION

Irrespective of the exact cause of the delamination problems which occur during thermal cycling at the interface between a thermoplastic body of an electrical connector and an overmolding material, it has been found that this problem can be obviated by incorporating a metal ring on the electrical connector such that the sealing interface between the electrical connector and the overmolding material occurs through adhesion between the overmolding material and the metal ring.

In accordance with certain aspects of the invention, there is provided an overmolded electronic assembly having a backplate, a circuit substrate on the backplate, a circuit device defined on the circuit substrate, an electrical connector joined to the backplate, a metal ring on the outer side of a thermoplastic wall member of the electrical connector, and an overmold body having a peripheral edge in adhesive contact with the metal ring. Because sealing of the overmold material to the electrical connectors occurs along the metal ring rather than with the thermoplastic body of the electrical connector, delamination problems associated with adhesion between the overmolding material and the thermoplastic body of the electrical connector are avoided.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
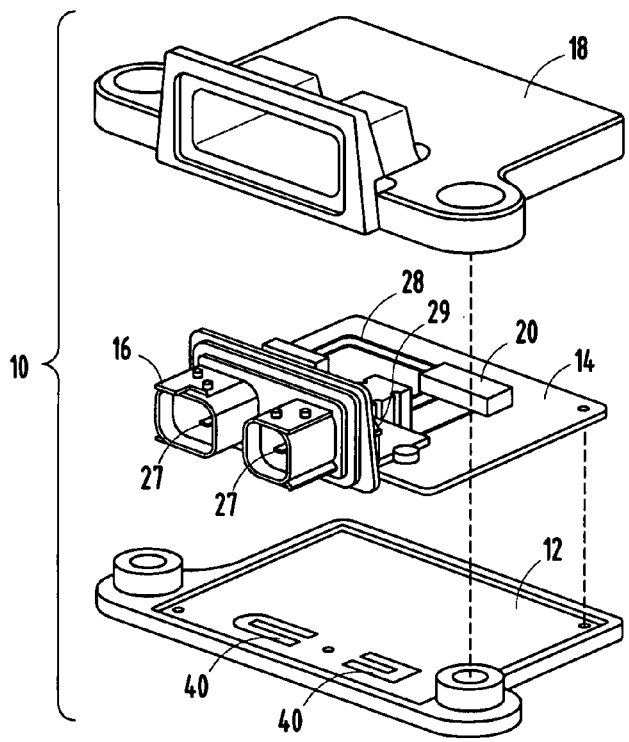
FIG. 1 is an assembly diagram in perspective view showing the components of the electronic assembly of the invention prior to completion of assembly.
Figure 3:
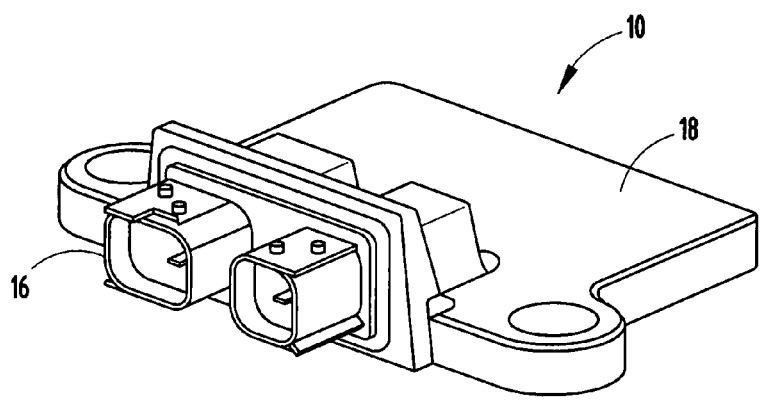
FIG. 3 is a perspective view of a completely assembled electronic assembly in accordance with the invention.

As shown in FIG. 1, an electronic assembly 10 in accordance with invention includes a backplate 12, a circuit substrate 14 on which is defined a circuit device, an electrical connector 16, and an overmold body 18. It is to be understood that overmold body 18 is typically molded directly over circuit substrate 14, and around peripheral edges of backplate 12 and electrical connector 16 to form an integrated structure or assembly 10 as shown in FIG. 3, with the overmold body adhering to peripheral edges of connector 16 and backplate 12 to seal circuit substrate 14 and the circuit device defined on circuit substrate 14 within the integrated structure of assembly 10.

Backplate 12 is a generally planar base member onto which the other components of the electronic assembly are added or assembled and serves as a part of a housing encasing the circuit substrate and circuit device defined on the circuit substrate. In order to avoid delamination issues at the interface between overmold body 18 and backplate 12, backplate 12 may be comprised or may consist of a metal or metal alloy. A suitable metal backplate 12 may be comprised or consist of aluminum or an aluminum alloy.

Circuit substrate 14 may comprise generally any printed circuit board, wiring board or the like on which electronic components may be mounted and on which electrically conductive traces may be defined.

Generally, any electronic component 20 or combination of electronic components may be mounted on circuit substrate 14 to define a circuit device that may be incorporated into an overmolded electronic assembly in accordance with the invention. Such electronic components include, without limitation, integrated circuits, transistors, diodes, resistors, capacitors, and the like. The circuit device may include a plurality of electronic components or a single electronic component such as an integrated circuit chip.

The electrical connectors 16 used in an electronic assembly 10 of the invention generally comprise a thermoplastic body 22 with embedded (e.g., insert molded) electrically conductive elements 24 that extend through a wall member 26 defined by the thermoplastic body, with opposite sections of each of the electrically conductive elements 24 projecting away from opposite sides of wall member 26 to provide external connector sections 27 that extend outwardly from the electronic assembly housing and internal electrical connector sections 29 that are connected with the circuit device defined on circuit substrate 14.

Electrically conductive traces 28 on circuit substrate 14 together with at least one electronic component 20 define the circuit device on circuit substrate 14. The interface or electrical connection between electrical traces 28 and electrically conductive elements 24 of the electrical connector may be achieved by any known or suitable means, such as by soldering. Alternatively, compliant pin technology may be employed.

Figure 2:
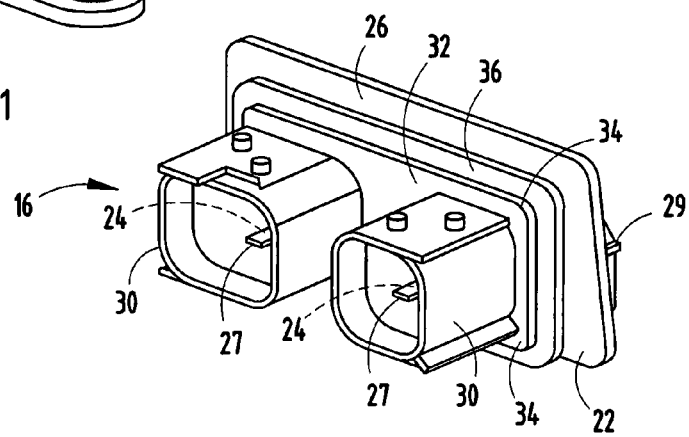
FIG. 2 is a perspective view of an electrical connector incorporated into the electronic assembly shown in FIGS. 1 and 3.

A more detailed front perspective view of electrical connector 16 is shown in FIG. 2. Body 22 of electrical connector 16 may be comprised of any suitable thermoplastic material such as acrylonitrile-butadiene-styrene (ABS), polypropylene, polycarbonate, etc., and may be filled or reinforced, such as with glass beads. Thermoplastic body 22 may be fabricated using generally any suitable molding technique, such as injection molding, with electrically conductive elements 24 embedded within wall member 26 of body 22, such as by utilizing an insert molding technique. Integrally defined by thermoplastic body 22 are shrouds 30 that circumscribe the external connector sections 27 of electrically conductive elements 24 that project from wall member 26. Shrouds 30 have conventional features for guiding a complementary connector into its proper position and interlocking with the complementary connector to achieve a sufficiently strong and tight connection to ensure a good electrical connection between electrically conductive elements 24 and electrically conductive elements on the complementary connectors. Also defined on or by thermoplastic body 22 is a circumferential rib or ledge 32 that surrounds outwardly projecting external connector sections 27 and shrouds 30. An outer surface 34 of ledge 32 is in contact with an inner surface of a metal ring 36 that also circumscribes outwardly projecting external connector sections 27 and shrouds 30. Ring 36 may be configured to achieve intimate contact with an outer surface 34 of ledge 32 along the entire circumferential perimeter of ledge 32, and may be disposed on wall member 26 to achieve intimate contact with wall member 26 along the entire circumference of ring 36. In order to assure a satisfactory seal between ring 36 and wall member 26 and/or outer surface 34 of ledge 32, an adhesive may be disposed between contacting surfaces of ring 36 and thermoplastic body 22. As another alternative, a satisfactory seal and adhesion between ring 36 and thermoplastic body 22 along the entire circumference of ring 36 may be achieved by using an onset molding technique. As another alternative, peripheral edges of overmold body 18 may extend over ring 36 to ledge 32 if desired. Metal ring 36 may comprise or be composed of aluminum or an aluminum alloy.

Except for the addition of metal ring 36 and overmolding of the assembly to achieve adhesion of peripheral edges of overmold body 18 with ring 36, other aspects of the process for fabricating overmolded electronic assembly 10 are generally conventional. In general, a circuit device is first fabricated on circuit substrate 14, and then electrical connector 16 is attached to circuit substrate 14 to provide a printed circuit board assembly in which electrical connections with the circuit device defined on circuit substrate 14 are achieved by electrical connection with external connector sections 27 projecting outwardly away from a housing defining the completed assembly 10 (as shown in FIG. 3). The printed circuit board assembly may be affixed to backplate 12 with an adhesive 40 and/or with fasteners such as screws. Thereafter, the combination of the printed circuit board assembly attached to the backplate may be placed in a molding fixture into which an overmold compound is provided to form an overmold body 18 which extends around and along peripheral edges of backplate 12 and along and around the circumferential outwardly facing surface of ring 36 to seal the printed circuit board assembly in a housing defined by backplate 12, thermoplastic body 22 of electrical connector 16 and overmold body 18, with all or substantially all of the seal joints being achieved by adhesion at interfaces between overmold body 18 and metal surfaces of backplate 12 and ring 36.

Overmold body 18 may be formed from a thermoset resin, which may be filled or not filled. Examples of thermoset resins which may be employed include epoxy resins, polyester resins, melamine resins, urea-formaldehyde resins, and the like. Fillers that may be employed include talc, silica, glass beads, etc. Overmold body 18 serves to join connector 16 to backplate 12 and complete a sealed housing for the electronic device defined on circuit substrate 14.

It has been found that the improved structure and processes of the invention eliminate delamination problems that occur during thermal cycling, ensure compound adhesion is consistent for the entire product (i.e., compound adhesion at ring 36 may be identical to compound adhesion with backplate 12), and improve corrosion resistance at the connector-to-compound interface.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An overmolded electronic assembly comprising:
   a backplate;
   a circuit substrate on the backplate;
   at least on electronic component mounted on the circuit substrate;
   electrically conductive traces defined on the circuit substrate, the electrically conductive traces and the at least one electronic component together defining a circuit device on the circuit substrate;
   an electrical connector joined to the circuit substrate, the electrical connector including a thermoplastic wall member having an inner side and an outer side, a plurality of electrically conductive elements extending through the thermoplastic wall member, a section of each electrically conductive element projecting away from the outer side of the thermoplastic wall member to define external connector pins, and a section of each electrically conductive element extending from the inner side of the thermoplastic wall member toward the circuit substrate and electrically connected to the circuit device defined on the circuit substrate;
   a metal ring on the outer side of the thermoplastic wall member and circumscribing the external connector pins; and
   an overmold body, the overmold body together with the backplate and thermoplastic wall member of the electrical connector sealingly encasing the circuit substrate and the circuit device defined on the substrate, the overmold body having a peripheral edge in adhesive contact with the metal ring.

2. The assembly of claim 1, wherein the metal ring is comprised or composed of aluminium or an aluminium alloy.

3. The assembly of claim 1, wherein the backplate is comprised or composed of a metal or metal alloy.

4. The assembly of claim 1, wherein the backplate is comprised or composed of an aluminum or an aluminum alloy.

5. The assembly of claim 1, wherein the circuit substrate is adhesively bonded to the backplate.

6. The assembly of claim 1, wherein an integral shroud projects from the thermoplastic wall member and surrounds the external connector pins.

7. The assembly of claim 1, wherein a ledge integrally projects from wall member and circumscribes the external connector pins, and an inner surface of the metal ring is in continuous and intimate contact with an outer surface of the ledge along a perimeter of the ledge.

\* \* \* \* \*